United States Patent [19]

Holbrook et al.

[11] 4,142,662
[45] Mar. 6, 1979

[54] METHOD OF BONDING MICROELECTRONIC CHIPS

[75] Inventors: Walter R. Holbrook, Reading, Pa.; Louis A. Koszi, Scotch Plains, N.J.

[73] Assignee: Bell Telephone Laboratories, Incorporated, Murray Hill, N.J.

[21] Appl. No.: 872,896

[22] Filed: Jan. 27, 1978

[51] Int. Cl.² .................... B23K 1/02; H01L 21/58
[52] U.S. Cl. ................................ 228/110; 228/123; 228/253; 156/73.1; 156/233
[58] Field of Search ............... 228/253, 254, 255, 110, 228/123; 156/73.1, 233

[56] References Cited

U.S. PATENT DOCUMENTS

| 3,470,611 | 10/1969 | McIver et al. ............... 228/110 X |
| 3,513,013 | 5/1970 | Willis et al. ............... 228/253 X |
| 3,781,978 | 1/1974 | Intrator et al. ............... 29/589 |

OTHER PUBLICATIONS

Herdzik et al., "Tinning Preplated Sites on a Substrate", IBM Technical Disclosure Bulletin, vol. 19, No. 8 (Jan. 1977), p. 3049.
Immendorfer, "Preparing Printed Circuits", IBM Technical Disclosure Bulletin, vol. 4, No. 12 (May 1962), p. 18.

Primary Examiner—C.W. Lanham
Assistant Examiner—K. J. Ramsey
Attorney, Agent, or Firm—Lester H. Birnbaum

[57] ABSTRACT

Disclosed is a method of bonding microelectronic chips to bonding surfaces utilizing thin, soft bonding material preforms. The bonding material, such as indium, is formed on a carrier strip. A portion of the material is transferred from the strip by bringing it in contact with the bonding surface and supplying pressure to the strip. The chip may then be bonded to the coated surface.

13 Claims, 6 Drawing Figures

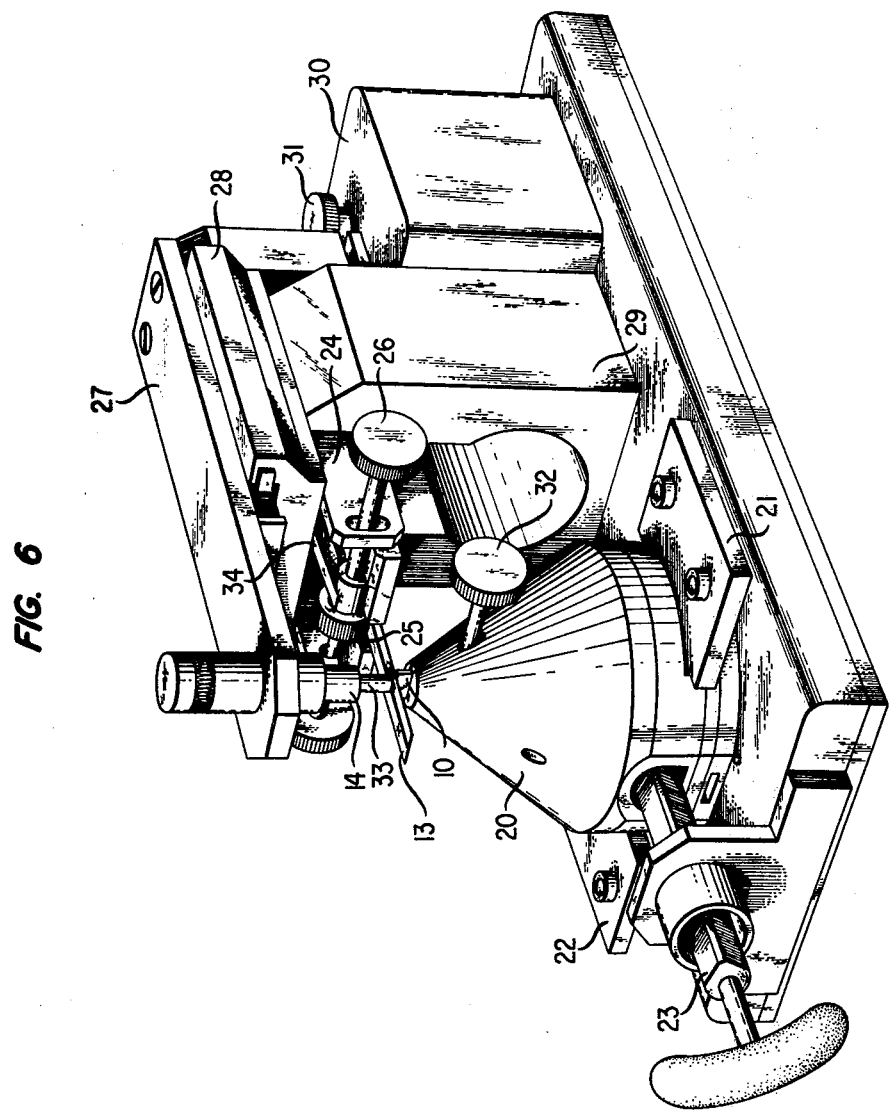

METHOD OF BONDING MICROELECTRONIC CHIPS

BACKGROUND OF THE INVENTION

This invention relates to microelectronic device and circuit fabrication, and in particular to a method of bonding microelectronic chips to various surfaces.

In many cases of microelectronic device and circuit fabrication, it is necessary to bond chips to surfaces such as headers, lead frames, ceramic substrates, and mounting studs where only extremely small areas are available for bonding. Basically, three approaches are followed when a soft, ductile bonding material such as a solder is used to form the bond. In one approach, the bonding material is in the form of a wafer preform which is placed on the bonding surface (see, for example, U.S. Pat. No. 3,781,978, issued to Intrator, et al.). Although adequate for many purposes, this method cannot be used effectively when soft ductile material, such as indium, is desired in thicknesses of 4 microns or less since physical handling of the preform is extremely difficult. An alternative method is to evaporate the bonding material into the bonding surface. This technique is also effective for most applications. In certain areas, however, such as bonding laser chips to rate the bonding material into the bonding surface. This technique is also effective for most applications. In certain areas, however, such as bonding laser chips to mounting studs, the evaporated metal tends to spatter upward from the sides of the stud during the bonding operation resulting in contamination of the mirror surfaces. A third approach involves the use of epoxy compounds deposited as a solid onto the bonding surface. Presently available epoxies cannot be used conveniently in certain applications, such as laser bonding, because the thermal impedance and the curing temperatures tend to be too high.

The invention is therefore directed to the problem of bonding microelectronic chips to bonding surfaces by means of a thin, soft ductile bonding layer where a preform is too small to be handled economically and the use of an evaporation procedure could result in device contamination.

SUMMARY OF THE INVENTION

This problem is solved in accordance with the invention by forming the bonding material on one surface of a carrier strip. In accordance with one embodiment, a thin layer of indium is evaporated onto a polyester strip. A portion of the indium layer is placed in contact with the bonding surface. Pressure is then applied to the opposite surface of the strip while heating the bonding surface, so that the portion of the indium layer in contact with the surface is transferred thereto. The microelectronic chip may then be placed on the indium layer and bonded to the bonding surface. Since the bonding material is confined to the desired bonding area and under the device, it does not spatter during the bonding operation.

BRIEF DESCRIPTION OF THE DRAWING

These and other features of the invention will be delineated in detail in the description to follow. In the drawing:

FIG. 6 is a perspective view of an apparatus which may be used for carrying out the invention in accordance with the same embodiment.

It will be appreciated that for purposes of illustration these figures are not drawn to scale.

DETAILED DESCRIPTION

The invention will be described in regard to bonding a laser chip to a mounting stud. It should be apparent, however, that the invention may be utilized wherever it is desired to bond microelectronic chips to a bonding surface such as a header or lead frame. The invention is especially advantageous where it is desired to use soft, ductile bonding preforms which are too small to be handled effectively.

Figure 1:
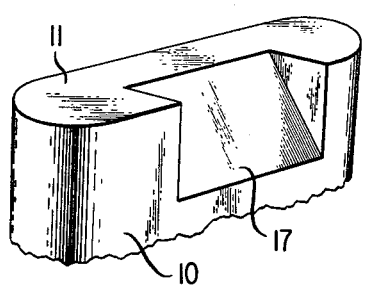
FIGS. 1-5 are schematic illustrations of various stages in the bonding of a chip to a mounting stud in accordance with one embodiment of the invention.
Figure 2:
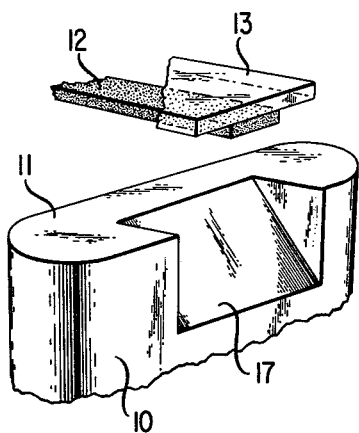

In this particular embodiment, it is desired to bond a laser chip to the top surface 11 of mounting stud 10, of FIG. 1 which also includes an inclined side surface 17. In order to apply the bonding material to this top surface, a carrier strip, 13 of FIG. 2, is provided with a layer of bonding material 12, formed on one surface. The carrier strip is shown as broken away for purposes of illustration. In this example, the material is indium and the carrier strip is a polyester tape with a thickness of approximately 2 mils. The particular material used for the carrier strip was polyethylene terephthalate which is sold by E. I. Dupont DeNemours under the trademark Mylar. It should be apparent that other soft, ductile bonding materials may be used, including lead, indium-lead alloys, gold, gold-germanium alloys, tin, and tin-lead alloys. It will also be appreciated that other materials may be used as the carrier strip as long as they are flexible and ductile and can stand up to the subsequent processing. Polyester materials in general would appear suitable.

The indium was formed on the carrier strip in the form of a longitudinal stripe, as shown, with a width of approximately 10 mils by standard vapor deposition techniques. That is, the surface of the carrier strip was masked by metal on the surface of the strip except on the area of the longitudinal stripe. The carrier strip was placed in a vacuum chamber with a pressure of $10^{-5}$ Torr or less. A pot of indium was placed inside a coil filament and a current passed therethrough. The indium was vaporized at a temperature of approximately 600 degrees C. and the stream of vapor directed to the carrier strip. The temperature of the depositing indium, due to travel distance, was less than its melting point. Deposition rate was approximately ½ micron per minute. It will be appreciated that other forms of deposition, such as cladding or sputtering, may be used to form the bonding material on the carrier strip. It should also be realized that geometries other than the stripe shown for layer 12 may be utilized.

The invention is most advantageous when the thickness of the layer 12 is 4 microns or less. A minimum thickness of 2 microns is desirable to insure coverage of the strip and provide enough material for bonding. The thickness of the carrier strip preferably lies within the range 1-10 mils. One advantage of the invention is the fact that the bonding layer can be provided over a large length of tape and stored so that a large quantity is available when needed.

Figure 3:
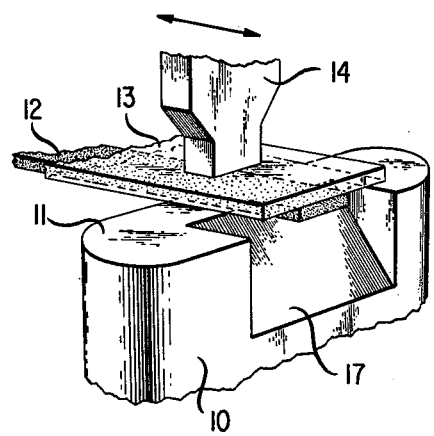

As shown in FIG. 3, a portion of the bonding layer 12 was brought into contact with the top surface of the mounting stud. The stud was heated to a temperature of 80-90 degrees C. in order to soften the material without melting and therefore enhance transferability. A range of 60–100 degrees C. for indium appears suitable. Of course, it will be realized that other temperatures may be chosen for different materials. When contact was made between the indium and bonding surface, a pressure applicator, 14, was brought into contact with the top surface of the carrier strip over the area of the indium stripe. Advantageously, the applicator surface is at least as wide as the indium stripe to insure complete transferral of the portion of the stripe in contact with the bonding surface. The applicator is preferably applied to the carrier strip surface with a minimum amount of pressure which will cause transferral. In this example, it was found that 1500–3000 psi was preferable. The skilled artisan can easily determine the ideal pressure for other materials and thicknesses.

In order to remove the bonding material from the strip, the applicator was moved essentially parallel to the bonding surface in the longitudinal direction of the stripe as shown by the arrow in FIG. 3. Advantageously, the carrier strip was moved along with the pressure applicator, although the strip could be held stationary. The agitation of the applicator and strip effected a scrubbing action causing the removal from the strip of the portion of the bonding material contacting the bonding surface. The longitudinal distance that the applicator moved was in the range 2–10 mils and the number of oscillations in the range 2–6.

Figure 4:
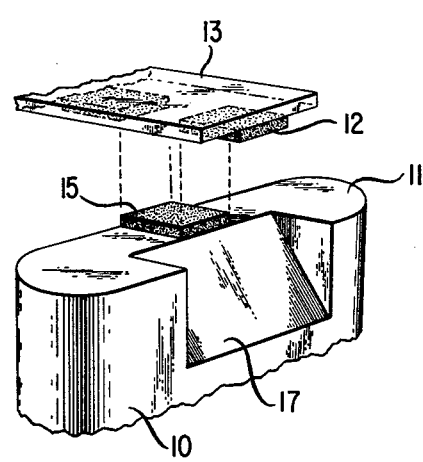

As shown in FIG. 4, when the carrier strip was removed, a bonding pad, 15, was left on the bonding surface with a thickness essentially equal to that of the stripe. It will be noted that the pad was deposited exactly where needed on the bonding surface and no significant amount of material was present on either of the sides of the mounting stud. This insures that no material will redeposit on the chip during the bonding operation. A flux of zinc ammonium chloride was then applied to the pad to break up any oxide formed on the indium surface and to prevent further oxidation during the bonding operation.

Figure 5:
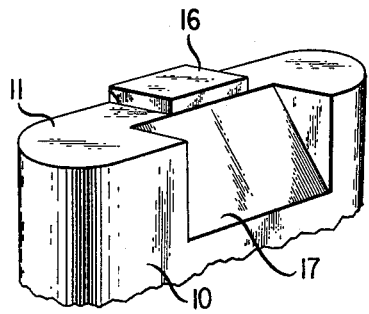

As shown in FIG. 5, the laser chip, 16, was placed on the bonding surface area including the bonding pad and bonded to the surface by standard techniques. In this example, the stud was heated to a temperature of 180–220 degrees C. for 10–25 seconds in an atmosphere of 15% $H_2$ and 85% $N_2$ and allowed to cool so that the indium formed an intermetallic with the gold on the surface of the laser chip.

One of the advantages which may accrue from using the present invention is the elimination of the fluxing operation. This is possible when the chip is bonded soon after the bonding material is applied to the bonding surface, since the surface of the material which contacts the chip was previously adjacent the carrier strip and therefore protected from oxidation. In such cases, it would be desirable to bond the chip in a neutral atmosphere such as nitrogen or in a reducing atmosphere.

One example of an apparatus which is suitable for practicing the invention is illustrated in FIG. 6. The mounting stud, 10, is placed within the conical jig, 20, which is slidably mounted in relation to plates 21 and 22. The stud is locked in place by screw 32. Rod 23 is coupled to the jig so that pushing the rod slides the jig into the position shown in the figure beneath the pressure applicator 14. The rod is coupled by means of a cam inside the jig (and therefore not shown) so that rotation of the rod raises the jig and causes the mounting stud to make contact with the carrier strip 13. Also included within the jig (and not shown) are cartridge heaters and a thermocouple to monitor the temperature of the stud. The carrier strip is provided in tray 24 and is fed to the bonding area by wheel 25 controlled by knob 26. Pressure is applied to the wheel by leaf spring 34 to maintain positive pressure on the tape. If desired, the strip could be supplied by a cartridge arrangement.

The pressure applicator 14, which includes a spring-loaded tip, 33, is rigidly mounted in block 27 which in turn is rigidly mounted to tray 24 through ball slide 28 to form a carriage assembly. The assembly is slidably mounted and spring loaded in holding block 29. Motion of the assembly is effected by motor 30 which causes the rotation of cam 31. The cam 31 is coupled by means of a standard cam follower arrangement to the spring-loaded carriage assembly. This causes the agitation of the pressure applicator and tape to remove the bonding material as previously described.

After transferral of the desired portion of the bonding material to the stud, the jig can be dropped down and pulled out by the action of the rod 23.

Various additional modifications will become apparent to those skilled in the art. All such variations which basically rely on the teachings through which the invention has advanced the art are properly considered within the spirit and scope of the invention.

I claim:

1. A method of bonding a microelectronic chip (16) to a bonding surface (11) comprising the steps of applying a bonding material (15) to at least a portion of the bonding surface and placing a microelectronic chip on the portion of the bonding surface including the bonding material, wherein the improvement comprises:
   providing a carrier strip (13) which includes on one surface a layer (12) of said bonding material;
   contacting a portion of said bonding material to the bonding surface; and
   applying pressure to the opposite surface of the carrier strip in order to transfer said portion of bonding material to the bonding surface.

2. The method according to claim 1 wherein the bonding material is a soft, ductile material.

3. The method according to claim 1 wherein the bonding material is selected from the group consisting of indium, gold, tin, lead and alloys thereof.

4. The method according to claim 1 wherein the bonding material is indium.

5. The method according to claim 1 wherein pressure is applied to the carrier strip by an applicator (14) which is agitated essentially parallel to the bonding surface.

6. The method according to claim 1 wherein the thickness of the bonding material is within the range 2–4 microns.

7. The method according to claim 1 wherein the bonding material is formed on the carrier strip by vapor deposition.

8. The method according to claim 1 wherein the bonding material is formed on the carrier strip in the form of a longitudinal stripe.

9. The method according to claim 1 wherein the thickness of the carrier strip lies within the range 1–10 mils.

10. The method according to claim 1 wherein the microelectronic chip is a laser device and the bonding surface is the top surface of a mounting stud (10).

11. The method according to claim 1 wherein the bonding material is heated while said pressure is applied.

12. A method of bonding a microelectronic chip (16) to a bonding surface (11) comprising the steps of applying a bonding material (15) selected from the group consisting of indium, gold, tin, lead, and alloys thereof to at least a portion of the bonding surface, placing a microelectronic chip on the portion of the bonding surface including the bonding material, and heating the resulting structure to bond the chip to the surface, wherein the improvement comprises:

vapor depositing a layer (12) of said bonding material onto at least a portion of one surface of a carrier strip (13);

contacting a portion of said bonding material to the bonding surface;

heating the bonding material to a temperature below its melting point; and applying pressure to the opposite surface of the carrier strip by means of a pressure applicator (14) in contact with the surface over the said portion of the bonding material, which applicator is agitated in order to transfer the said portion of bonding material to the bonding surface.

13. A method of bonding a microelectronic laser chip (16) to the surface (11) of a mounting stud (10) comprising the steps of applying a layer of indium (15) to a portion of the surface of the mounting stud, placing the laser chip on the portion of the surface including the indium layer, and heating the resulting structure to a temperature below the melting point of indium to bond the chip to the surface, wherein the improvement comprises:

vapor depositing the indium in the shape of a longitudinal stripe (12) with a thickness of 2-4 microns onto one surface of a polyester strip (13);

contacting a portion of said indium stripe to the surface of the mounting stud;

heating the indium to a temperature of 60-100 degrees C.;

applying pressure to the opposite surface of the polyester strip by means of a pressure applicator (14) in contact with the surface over said portion of the indium stripe; and agitating the applicator and polyester strip in the longitudinal direction of the indium stripe to transfer the portion of the indium stripe to the surface of the mounting stud.

* * * * *

UNITED STATES PATENT AND TRADEMARK OFFICE
CERTIFICATE OF CORRECTION

PATENT NO. : 4,142,662

DATED : March 6, 1979

INVENTOR(S) : Walter R. Holbrook and Louis A. Koszi

It is certified that error appears in the above-identified patent and that said Letters Patent are hereby corrected as shown below:

Column 1, line 25, after "applications." delete "In certain";
line 26, delete entire line;
line 27, delete entire line;
line 28, delete "nique is also effective for most applications."

Signed and Sealed this

Seventh Day of August 1979

[SEAL]

Attest:

LUTRELLE F. PARKER

Attesting Officer    Acting Commissioner of Patents and Trademarks